(12) United States Patent
Otsuka et al.

(10) Patent No.: US 9,937,602 B2
(45) Date of Patent: Apr. 10, 2018

(54) SUBSTRATE PROCESSING METHOD

(71) Applicant: TOSHIBA MEMORY CORPORATION, Tokyo (JP)

(72) Inventors: Yosuke Otsuka, Mie (JP); Masako Kodera, Kanagawa (JP); Yukiteru Matsui, Aichi (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/260,439

(22) Filed: Sep. 9, 2016

(65) Prior Publication Data
US 2016/0375547 A1    Dec. 29, 2016

Related U.S. Application Data

(63) Continuation of application No. 14/644,724, filed on Mar. 11, 2015, now abandoned.

(30) Foreign Application Priority Data

Apr. 11, 2014    (JP) ................................. 2014-081988

(51) Int. Cl.
*B24B 37/04*    (2012.01)
*B24B 37/10*    (2012.01)
(Continued)

(52) U.S. Cl.
CPC .............. *B24B 53/007* (2013.01); *B24B 1/00* (2013.01); *B24B 37/04* (2013.01); *B24B 37/042* (2013.01); *B24B 37/044* (2013.01); *B24B 37/10* (2013.01)

(58) Field of Classification Search
CPC ......... B24B 1/00; B24B 37/04; B24B 37/042; B24B 37/044; B24B 37/10; B24B 53/007
(Continued)

(56) References Cited

U.S. PATENT DOCUMENTS 6,436,302 B1 *  8/2002  Li ..................... H01L 21/02074
                                                          134/3
7,498,295 B2    3/2009  Fisher et al.
(Continued)

FOREIGN PATENT DOCUMENTS

JP    2009-55020 A    3/2009
JP    2009-81475 A    4/2009
JP    2014-36136 A    2/2014

OTHER PUBLICATIONS

Office Action issued by the Taiwanese Intellectual Property Office dated Mar. 21, 2016, in counterpart Taiwanese Patent Application No. 104105712.

*Primary Examiner* — Eileen Morgan
(74) *Attorney, Agent, or Firm* — Finnegan, Henderson, Farabow, Garrett & Dunner, L.L.P.

(57) ABSTRACT

In a substrate processing method according to an embodiment, a surface of an object to be polished disposed on a substrate is polished on a polishing pad supplied with slurry. After the polishing process using the slurry, the surface of the object to be polished on the polishing pad is polished, while supplying water on the polishing pad where a residue including the slurry or a sludge of the polishing pad adhered. After the polishing process using the water, the surface of the object to be polished is cleaned on the polishing pad by supplying rinse liquid on the polishing pad.

11 Claims, 10 Drawing Sheets

(51) Int. Cl.
*B24B 53/007* (2006.01)
*B24B 1/00* (2006.01)

(58) Field of Classification Search
USPC .............................................. 451/36, 41, 56
See application file for complete search history.

(56) References Cited

U.S. PATENT DOCUMENTS

| | | | |
|---|---|---|---|
| 7,922,823 B2* | 4/2011 | Walker | C11D 7/06 |
| | | | 134/1.3 |
| 2004/0152318 A1* | 8/2004 | Fukushima | H01L 21/02074 |
| | | | 438/689 |
| 2005/0003737 A1* | 1/2005 | Montierth | A61B 8/546 |
| | | | 451/5 |
| 2006/0166847 A1* | 7/2006 | Walker | C11D 7/261 |
| | | | 510/175 |

\* cited by examiner

NUMBER OF RESIDUES ON Cu WIRING

NUMBER OF RESIDUES ON TEOS FILM

NUMBER OF RESIDUES ON Cu WIRING

NUMBER OF RESIDUES ON TEOS FILM

SUBSTRATE PROCESSING METHOD

CROSS REFERENCE TO RELATED APPLICATION(S)

This application is a continuation of U.S. application Ser. No. 14/644,724 filed Mar. 11, 2015 (now pending), which is based upon and claims the benefit of priority from the prior Japanese Patent Application No. 2014-081988, filed on Apr. 11, 2014. The entire contents of these prior applications are incorporated herein by reference.

FIELD

Embodiments described herein relate generally to a substrate processing method.

BACKGROUND

Recently, a Chemical Machine Polishing (CMP) method is utilized as a method for processing a surface of a object to be polished. A silicon dioxide film, a contact plug, metal wiring, and the like on a substrate surface are planarized by the CMP method. In a substrate processing method for a semiconductor device including a fine pattern, it is demanded to reduce defect density and improve productivity as problems to be solved.

As a substrate processing method in a related art, there is a known method in which buffing polishing is executed using solution, rinsing is executed using deionized water (DIW) or inhibitor solution, buffing polishing is executed using slurry, and rinsing is executed using the DIW or the inhibitor solution after the substrate surface is planarized by the CMP method.

However, according to the above substrate processing method in the related art, a residue adhered to the substrate surface is hardly cleaned sufficiently. Further, scratch may be caused on the substrate surface because buffing polishing is executed while the residue is not sufficiently cleaned.

DETAILED DESCRIPTION

Embodiments will now be explained with reference to the accompanying drawings. The present invention is not limited to the embodiments.

In a substrate processing method according to an embodiment, a surface of an object to be polished disposed on a substrate is polished on a polishing pad supplied with slurry. After the polishing process using the slurry, the surface of the object to be polished on the polishing pad is polished, while supplying water on the polishing pad where a residue including the slurry or a sludge of the polishing pad adhered. After the polishing process using the water, the surface of the object to be polished is cleaned on the polishing pad by supplying rinse liquid on the polishing pad.

(Substrate Processing Device)

Figure 1:
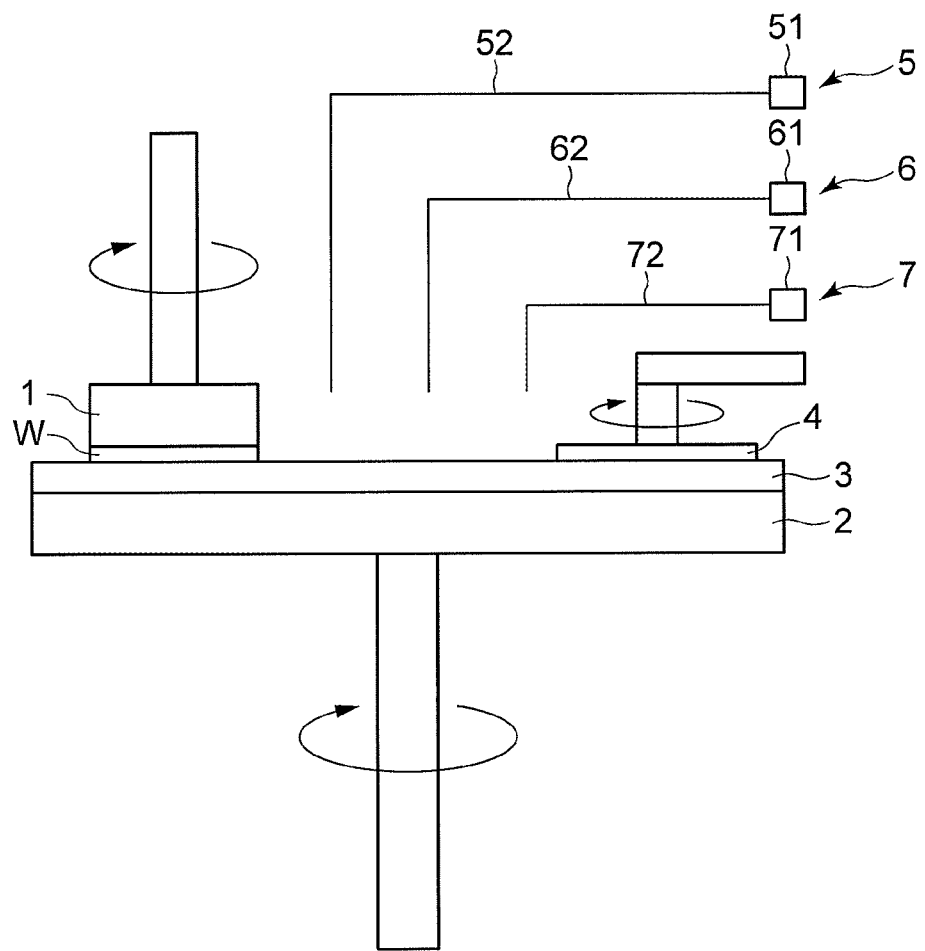
FIG. 1 is a diagram illustrating a structure of a substrate processing device according to an embodiment.

First, a substrate processing device according to an embodiment will be described with reference to FIG. 1. Here, note that FIG. 1 is a diagram illustrating a structure of the substrate processing device according to the present embodiment. The substrate processing device in FIG. 1 is a device to polish and planarize a surface of an object to be polished by the CMP method. The object to be polished may include a semiconductor substrate (hereinafter referred to as "substrate") W, and a material layer laminated on the substrate W. In the following, the surface of the object to be polished is referred to simply as a surface of the substrate W.

The substrate processing device includes a holder 1, a platen 2, a polishing pad 3, a conditioner 4, a slurry supplier 5, a water supplier 6, and a rinse liquid supplier 7.

The holder (polishing header) 1 holds the substrate W such that the surface of the substrate W faces the polishing pad 3, more specifically, the surface of the substrate W faces a lower side of FIG. 1. The holder 1 rotates the substrate W while pressing the substrate W against the polishing pad 3 side, and polishes the surface of the substrate W.

The platen 2 includes a disk-shaped rotatable turntable. The polishing pad 3 is fixed on the platen 2.

The polishing pad 3 is formed of a material such as foamed polyurethane, and fixed on the platen 2. The material of the polishing pad 3 is selected based on quality of material of the surface of the substrate W to be polished.

The conditioner (dresser) 4 includes a disk-shaped member configured to press the surface of the polishing pad 3 while rotating the same, and unevenness of the polishing pad 3 generated by polishing the substrate W is mended (planarized). In this manner, the substrate processing device can planarize the surface of the substrate W with accuracy.

The slurry supplier 5 supplies slurry for polishing the surface of the substrate W onto the polishing pad 3. The slurry supplier 5 includes a reservoir 51 to store the slurry, and piping 52 to supply the slurry of the reservoir 51 onto the polishing pad 3. The slurry includes an abrasive grain and processing solution. For the abrasive grain, $SiO_2$ (silica), $Al_2O_3$, $CeO_2$, $Mn_2O_3$, diamond, and the like are used, for example. Further, the processing solution includes, for example, a modifying agent of the substrate W, a dispersing agent of the abrasive grain, a surfactant agent, a chelate agent, and anticorrosive. The abrasive grain and the processing solution are selected based on the quality of material of the substrate W to be polished.

The water supplier 6 supplies water for polishing the surface of the substrate W onto the polishing pad 3. The water supplier 6 includes a reservoir 61 to store the water and piping 62 to supply the water of the reservoir 61 onto the polishing pad 3. For the water, DIW is used, for example.

The rinse liquid supplier 7 supplies rinse liquid for polishing the surface of the substrate W onto the polishing pad 3. The rinse liquid supplier 7 includes a reservoir 71 to store the rinse liquid and piping 72 to supply the rinse liquid of the reservoir 71 onto the polishing pad 3. The rinse liquid is selected based on the quality of material of the substrate W to be polished and a slurry component. The rinse liquid will be described later in detail.

As described above, the substrate processing device according to the embodiment, the surface of the substrate W can be consecutively polished using the slurry, water, and rinse liquid on the same platen 2. Therefore, compared to a case where polishing is performed on different platens 2 with the slurry, water, and rinse liquid, throughput of the surface of the substrate W can be improved.

Meanwhile, in addition to the above described components, the substrate processing device may include a collector for the slurry used for polishing, and also may be integrally formed with at least one of a buffing polisher, a roll brush cleaner, and a rinse cleaner.

(Substrate Processing Method)

Figure 2:
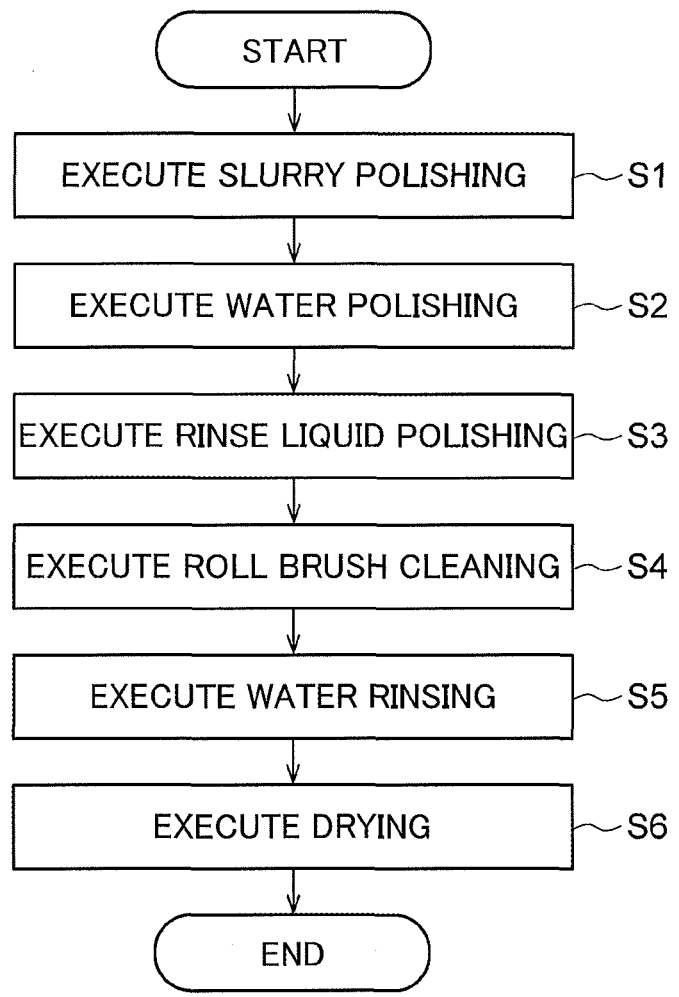
FIG. 2 is a flowchart illustrating a substrate processing method according to an embodiment.
Figure 3:
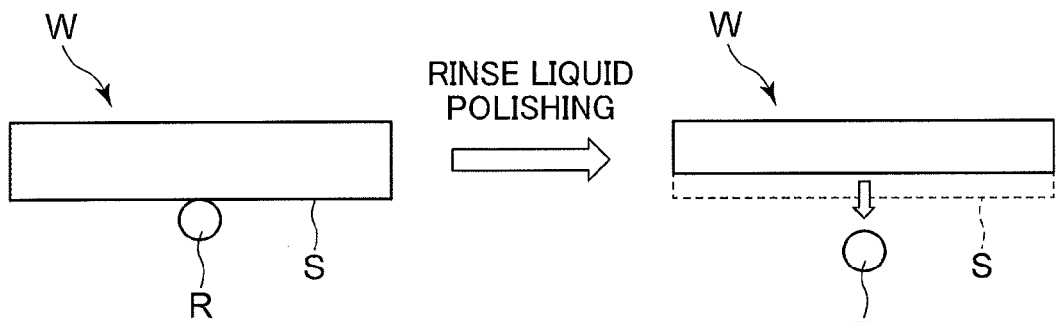
FIG. 3 is an explanatory diagram for describing a residue removal method with rinse liquid.
Figure 4:
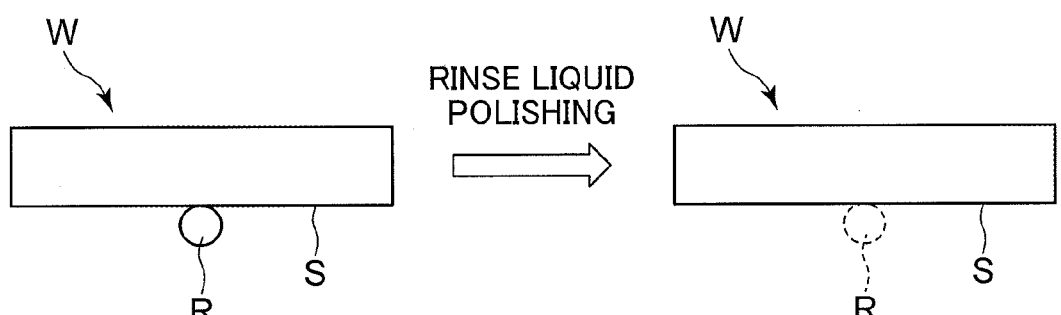
FIG. 4 is an explanatory diagram for describing the residue removal method with rinse liquid.

Next, a substrate processing method according to an embodiment will be described with reference to FIGS. 2 to 4. Here, note that FIG. 2 is a flowchart illustrating an example of the substrate processing method according to the present embodiment. In the following, the case of using the substrate processing device in FIG. 1 will be described.

According to the present embodiment, the surface of the substrate W is first polished using slurry (Step S1). More specifically, while the slurry is supplied from the slurry supplier 5 onto the polishing pad 3, the holder 1 makes the surface of the substrate W contact with the polishing pad 3, and rotates the substrate W while pressing the same. The surface of the substrate W is polished and planarized by this. The slurry component, a supply rate of the slurry, pressure to be applied to the substrate W (polishing load), and a polishing period are selected based on the quality of material of the substrate W and the like.

Next, the surface of the substrate W is polished using the water such as DIW (Step S2). More specifically, while the water is supplied from the water supplier 6 onto the polishing pad 3, the holder 1 makes the surface of the substrate W contact with the polishing pad 3, and rotates the substrate W while pressing the same. The residue adhered to the surface of the substrate W in Step S1 is removed by this. The residue referred here includes the abrasive grain of the slurry, polishing sludge of the polishing pad 3, and the like. Further, in the case where the surface of the substrate W includes metal wiring, the residue may include a compound (complex and insoluble aggregate) generated from the slurry component and a metal included in metal wiring. A supply rate of the water, pressure to be applied to the substrate W (polishing load), and a polishing period are selected based on the quality of material of the substrate W, the slurry component, and the like.

Next, the surface of the substrate W is polished using rinse liquid (Step S3). More specifically, while the rinse liquid is supplied from the rinse liquid supplier 7 onto the polishing pad 3, the holder 1 makes the surface of the substrate W contact with the polishing pad 3, and rotates the substrate W while pressing the same. The residue not removed in Step S2 and still adhered to the surface of the substrate W is further removed by this. Note that a small amount of water may also be supplied onto the polishing pad 3 together with the rinse liquid at this point.

Now, the rinse liquid will be described. The rinse liquid is solution to remove the residue adhered to the surface of the substrate W, and has an acid or alkaline property same as slurry. More specifically, in the case where the slurry is acid, the rinse liquid is also acid, and in the case where the slurry is alkaline, the rinse liquid is also alkaline. This is because salt may be generated by the reaction of the slurry with the rinse liquid and the residue may be increased in the case where the degrees of acidity or alkalinity of the slurry and the rinse liquid are opposite, more specifically, in the case where one is acid and the other is alkaline.

Further, the rinse liquid has dissolving property for at least a part of the surface of the substrate W. Therefore, in the case of polishing the surface of the substrate W with the rinse liquid, a portion of a surface S of the substrate W having the dissolving property in the rinse liquid is dissolved, and a residue R adhered to the portion can be removed as illustrated in FIG. 3. The rinse liquid may have the dissolving property for an entire surface of the substrate W or may selectively have the dissolving property for a part of the surface of the substrate W (e.g., metal wiring). Note that thickness of the substrate surface to be polished by polishing using the rinse liquid is, preferably, 10 nm or less, in order to keep flatness of the substrate surface.

Further, the rinse liquid has the dissolving property for at least a part of the residue adhered to the surface of the substrate W. Therefore, in the case of polishing the surface of the substrate W with the rinse liquid, the residue R for which the rinse liquid has the dissolving property is dissolved by rinse liquid as illustrated in FIG. 4. Therefore, the residue R can be removed. The rinse liquid may have the dissolving property for all kinds of residues adhered to the surface S of the substrate W, or may selectively have the dissolving property for some kinds of residues (e.g., metal complex).

Note that the rinse liquid may have only either the dissolving property for the surface of the substrate W or the dissolving property for the residue adhered to the surface of the substrate W. The component of the rinse liquid, a supply rate of the rinse liquid, pressure to be applied to the substrate W (polishing load), and a polishing period are selected based on the quality of material of the substrate W and the slurry component.

After polishing the surface of the substrate W with the rinse liquid, a front surface and a back surface of the substrate W are cleaned with a roll brush made of PVA and the like (Step S4). More specifically, the substrate W is cleaned with the roll brush while supplying chemical solution, and the substrate W is cleaned with the roll brush while supplying the water. For the chemical solution, any chemical solution including the above rinse liquid may be used. Further, for the water, DIW can be used. The residue adhered to the substrate W, slurry and a component of the rinse liquid are removed by this. The roll brush cleaning can be executed by a roll brush cleaner (not illustrated) provided with the roll brush and the units to supply the chemical solution and water. In the roll brush cleaning, plural kinds of chemical solution may be used. In this case, cleaning using the chemical solution and the water are alternately executed.

Next, the front surface and the back surface of the substrate W are rinsed with the water such as DIW (Step S5), and then the substrate W is dried (Step S6).

As described above, according to the substrate processing method of the present embodiment, the residue adhered to the surface of the substrate W can be reduced by polishing the surface of the substrate W with the water and the rinse liquid. Additionally, since the residue is reduced, scratch generated on the substrate surface by the residue damaging the surface of the substrate W can be reduced. Therefore, according to the substrate processing method of the present embodiment, a defect of the substrate surface can be reduced, thereby improving reliability of the semiconductor device such as a memory, a system LSI, a high speed logic LSI, and a memory-logic mixed LSI.

Further, in the case of using the above-described substrate processing device, throughput of substrate processing can be improved because the surface of the substrate W can be consecutively polished on the same platen 2, using the slurry, water, and rinse liquid (Steps S1 to S3).

Note that polishing the substrate surface with the slurry, water, and rinse liquid can be executed using different platens.

In the following, respective examples of the rinse liquid used in the substrate processing method will be described with reference to the drawings.

First Example

Figure 5:
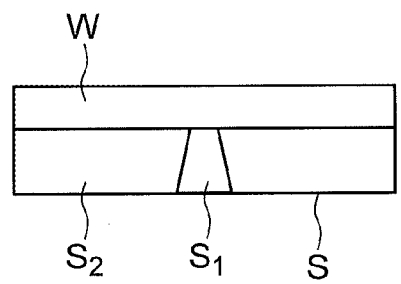
FIG. 5 is a cross-sectional view illustrating a substrate according to a first example.

First, a first example will be described with reference to FIGS. 5 to 14. FIG. 5 is a cross-sectional view illustrating a substrate W to be polished in the present example. As illustrated in FIG. 5, a surface S of the substrate W is provided with Cu wiring $S_1$ and a tetraethyl orthosilicate film (hereinafter referred to as "TEOS film") $S_2$. Therefore, according to the present example, rinse liquid to remove a residue adhered to the Cu wiring $S_1$ and the TEOS film $S_2$ is used.

Figure 6:
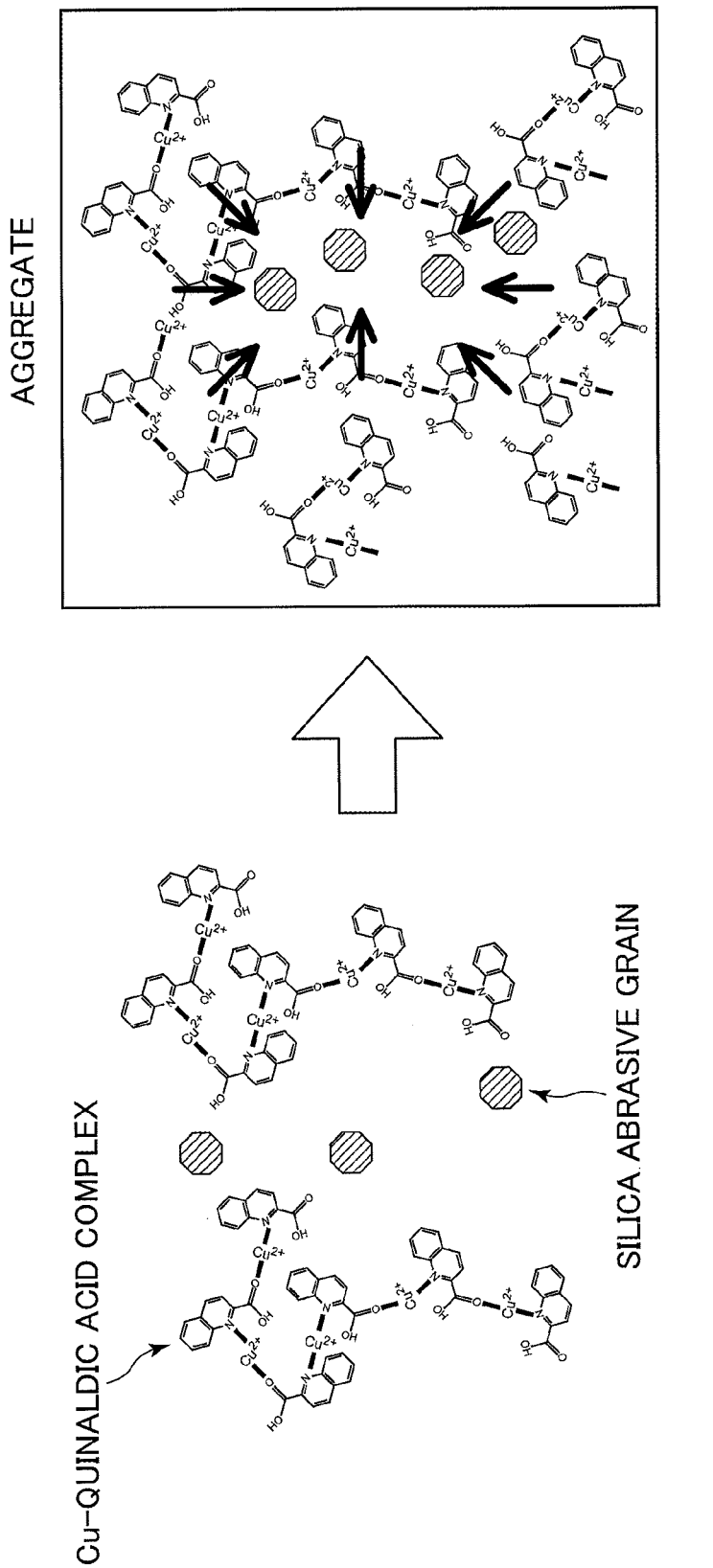
FIG. 6 is an explanatory diagram for Cu-quinaldic acid complex.

Generally, slurry used to polish Cu is alkaline and includes quinaldic acid, benzotriazole (hereinafter referred to as "BTA"), and the like. Therefore, in the case of polishing the Cu wiring $S_1$ with the slurry, the residue is generated from Cu included in the Cu wiring $S_1$, and quinaldic acid and BTA included in the slurry. For example, a Cu-quinaldic acid complex formed of Cu and quinaldic acid is generated as the residue. Further, in the case where the abrasive grain included in the slurry is silica such as $SiO_2$, an aggregate including the Cu-quinaldic acid complex and the silica abrasive grain is generated as illustrated in FIG. 6. The same occurs in the case of BTA as well, and a Cu-BTA complex and an aggregate are generated.

Figure 7:
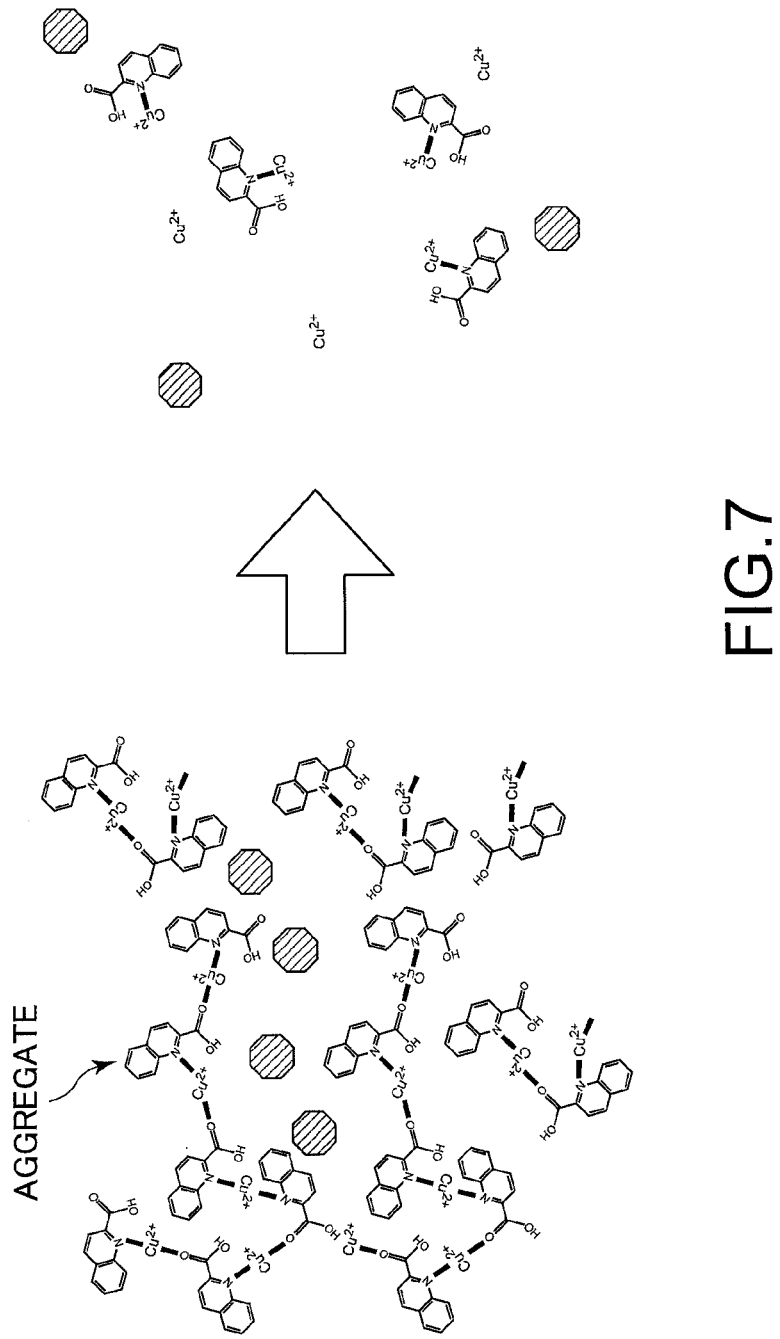
FIG. 7 is an explanatory diagram for the Cu-quinaldic acid complex.

Therefore, alkaline rinse liquid having the dissolving property for the above complex is used in the present example. In the case where the rinse liquid has the dissolving property for the Cu-quinaldic acid complex, the Cu-quinaldic acid complex is dissolved and removed, and further the aggregate is also dissolved and removed as illustrated in FIG. 7. The same occurs in the case of Cu-BTA complex as well.

Further, according to the present example, the rinse liquid having the dissolving property for Cu is used. The residue adhered to the surface of the Cu wiring $S_1$ can be removed by dissolving the surface thereof.

For such rinse liquid, the rinse liquid having pH 8 or higher and containing following components (A) to (F) is used.

(A) Tetramethyl ammonium hydroxide
(B) Diamines selected from a group including ethylenediamine and 1,2-diaminopropane
(C) Organic acid selected from a group including oxalic acid, citric acid, tartaric acid, malic acid, and picoline acid
(D) Histidine or derivative thereof
(E) At least one kind selected from a group including benzotriazol, imidazole, triazole, tetrazole, and derivative thereof
(F) Water The above component (B) may corrode the Cu wiring $S_1$ in the case of being excessively added. Therefore, preferably, 1,2-diaminopropane having 0.0001 to 0.4 mass % is contained as the component (B). In the case of using the rinse liquid containing 1,2-diaminopropane in this range, it is confirmed in a TEST that the residue can be removed without corroding the Cu wiring $S_1$. Further, preferably, citric acid is contained as the component (C). Further, the above component (D) may actually increase the residue in the case of being excessively added. Therefore, preferably, histidine having 0.002 to 3 mass % is contained as the component (D). In the case of using the rinse liquid containing histidine in this range, it is confirmed in the TEST that the residue can be removed without being increased.

Figure 8:
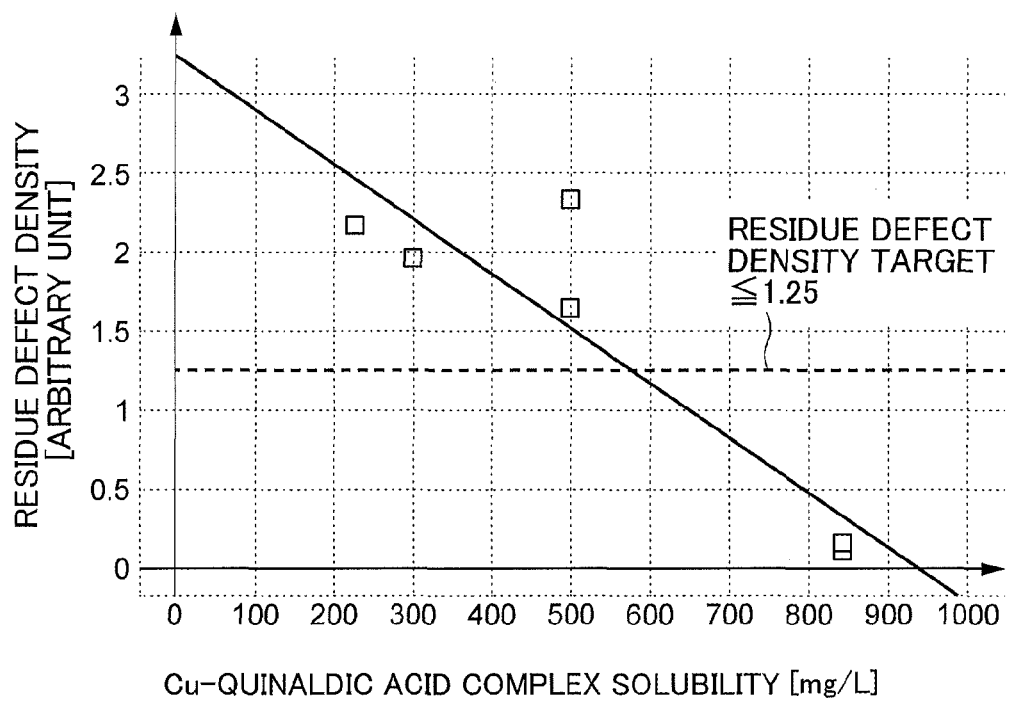
FIG. 8 is a diagram illustrating a relation between solubility and residue defect density.

Here, note that FIG. 8 is a diagram illustrating a relation between solubility of the above-described rinse liquid and the residue. In FIG. 8, a horizontal axis represents solubility (mg/L) of the rinse liquid with respect to Cu-quinaldic acid complex, and a vertical axis represents residue defect density indicating the number of residues in a unit area of the substrate surface. As illustrated in FIG. 8, when the solubility of the rinse liquid is increased, the residue defect density is decreased. Therefore, desired residue defect density can be obtained by adjusting the solubility of the rinse liquid.

For example, in the case of the substrate W demanded to have the residue defect density of 1.25 or less, the rinse liquid having the solubility of 600 mg/L or more with respect to Cu-quinaldic acid complex may be used in accordance with the relation illustrated in FIG. 8.

Figure 9:
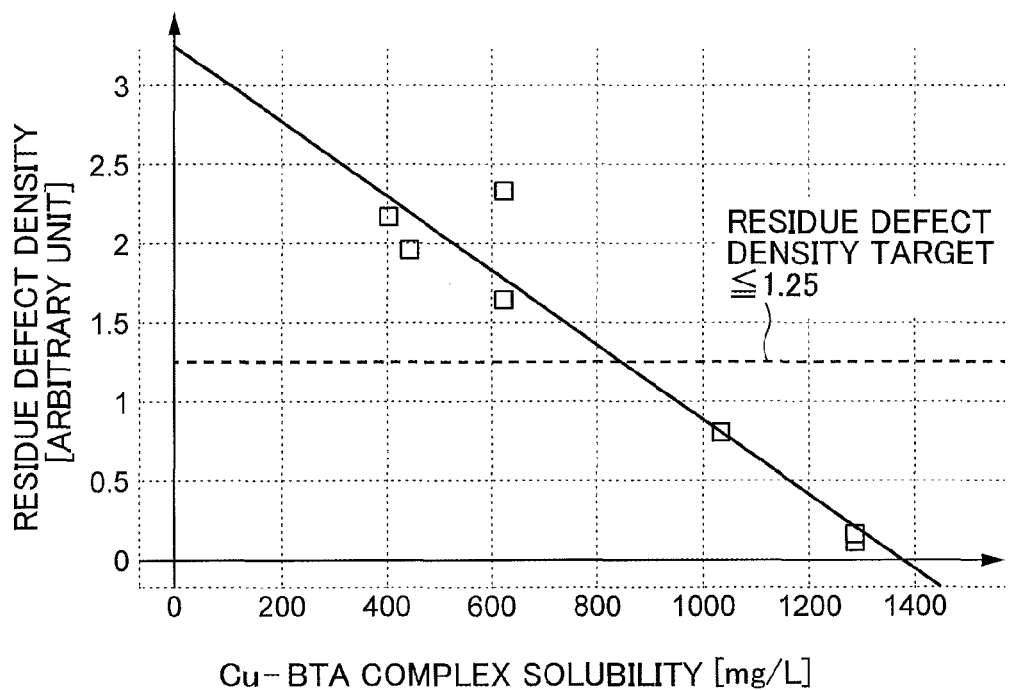
FIG. 9 is a diagram illustrating the relation between solubility and residue defect density.

FIG. 9 is a diagram illustrating the relation between solubility of the rinse liquid and the residue, same as FIG. 8. In FIG. 9, the horizontal axis represents solubility (mg/L) of the rinse liquid with respect to Cu-BTA complex, and the vertical axis represents the residue defect density indicating the number of residues in the unit area of the substrate surface. As illustrated in FIG. 9, when the solubility of the rinse liquid is increased, the residue defect density is decreased. Therefore, desired residue defect density can be obtained by adjusting the solubility of the rinse liquid.

For example, in the case of the substrate W demanded to have the residue defect density of 1.25 or less, the rinse liquid having the solubility of 800 mg/L or more with respect to Cu-BTA complex may be used in accordance with the relation illustrated in FIG. 9.

Figure 10:
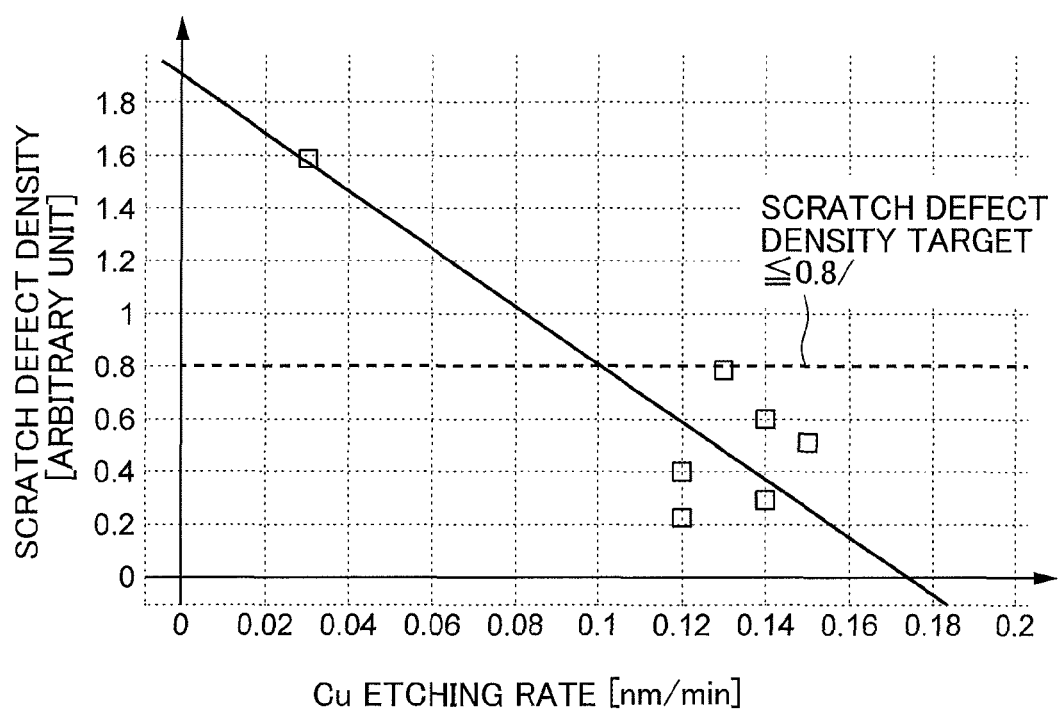
FIG. 10 is a diagram illustrating a relation between an etching rate and scratch defect density.

FIG. 10 is a diagram illustrating a relation between an etching rate of the rinse liquid and scratch. In FIG. 10, the horizontal axis represents the etching rate (nm/min) of the rinse liquid with respect to Cu, and the vertical axis represents the scratch defect density indicating the number of scratches in the unit area of the substrate surface. As illustrated in FIG. 10, when the etching rate is increased, the scratch defect density is decreased. Therefore, desired scratch defect density can be obtained by adjusting the etching rate of the rinse liquid.

For example, in the case of the substrate W demanded to have the scratch defect density of 0.8 or less, the rinse liquid having the etching rate of 0.1 nm or more with respect to Cu may be used in accordance with the relation illustrated in FIG. 10.

In the following, TEST results in the case of removing the residue by the substrate processing method of the present example will be described. FIGS. 11 to 14 are diagrams illustrating the TEST results. The TESTs are executed under the following conditions.

For the substrate processing device (CMP device), FREX300E manufactured by EBARA Corporation is used.

For the polishing pad, a foamable pad (IC1000) manufactured by Nitta Haas Incorporated is used.

For the slurry, silica slurry (CMS84xx series) manufactured by JSR Corporation is used.

Figure 11:
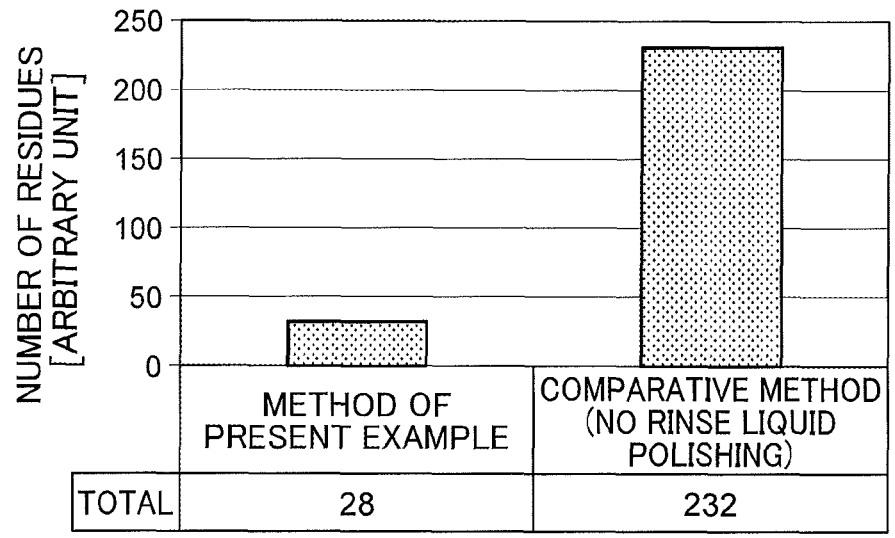
FIG. 11 is a diagram illustrating a TEST result based on a substrate processing method according to the first example.

FIG. 11 is a diagram illustrating the number of residues on the Cu wiring $S_1$ after drying the substrate. The left side of FIG. 11 represents the number of residues in the case of adopting the substrate processing method according to the present example in which the above-described rinse liquid is used. The right side of FIG. 11 represents the number of residues in the case of omitting polishing with the rinse liquid (Step S3). As illustrated in FIG. 11, the case of adopting the method of the present example has the reduced number of residues on the Cu wiring $S_1$ than the case of adopting a comparative method in which polishing with the rinse liquid is omitted.

Figure 12:
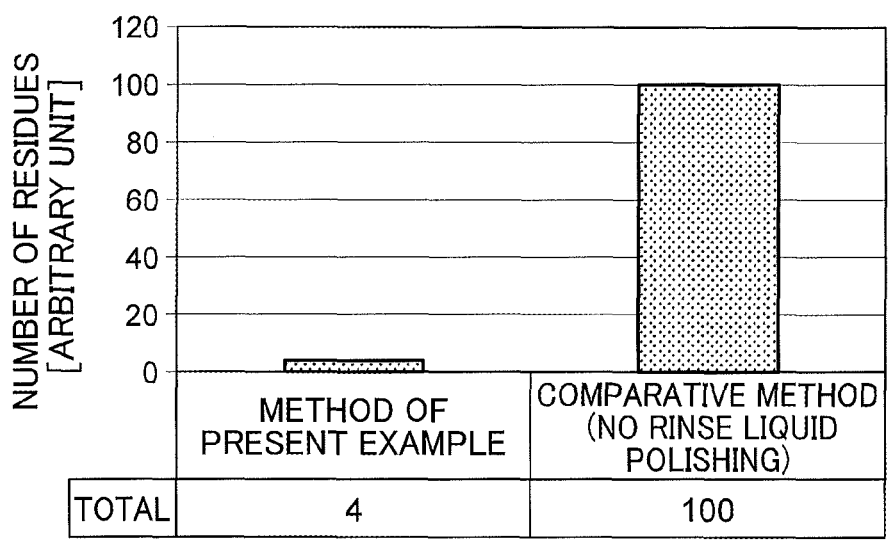
FIG. 12 is a diagram illustrating the TEST result based on the substrate processing method according to the first example.

FIG. 12 is a diagram illustrating the number of residues on the TEOS film $S_2$ after drying the substrate. The left side of FIG. 12 represents the number of residues in the case of adopting the substrate processing method according to the present example in which the above-described rinse liquid is used. The right side of FIG. 12 represents the number of residues in the case of omitting polishing with the rinse liquid. As illustrated in FIG. 12, the case of adopting the method of the present example has the reduced number of residues on the TEOS film $S_2$ than the case of adopting the comparative method in which polishing with the rinse liquid is omitted.

Figure 13:
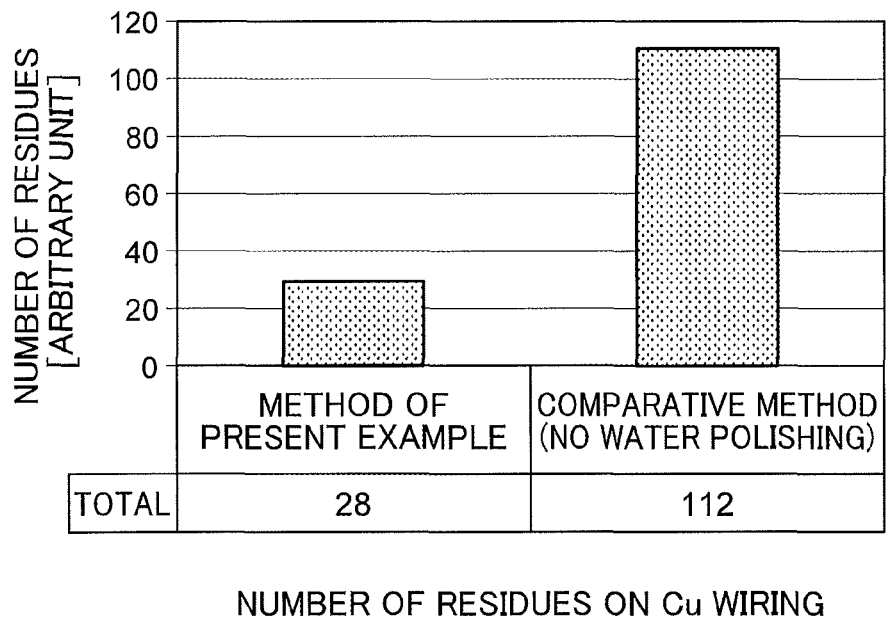
FIG. 13 is a diagram illustrating the TEST result based on the substrate processing method according to the first example.

FIG. 13 is a diagram illustrating the number of residues on the Cu wiring $S_1$ after drying the substrate. The left side of FIG. 13 represents the number of residues in the case of adopting the substrate processing method according to the present example in which the above-described rinse liquid is used. The right side of FIG. 13 represents the number of residues in the case of omitting polishing with water (Step S2). As illustrated in FIG. 13, the case of adopting the method of the present example has the reduced number of residues on the Cu wiring $S_1$ than the case of adopting a comparative method in which polishing with the water is omitted.

Figure 14:
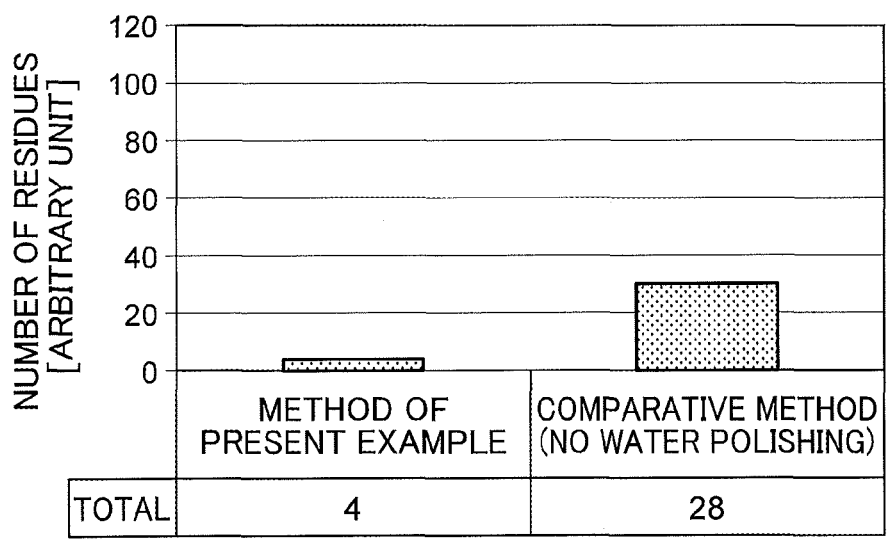
FIG. 14 is a diagram illustrating the TEST result based on the substrate processing method according to the first example.

FIG. 14 is a diagram illustrating the number of residues on the TEOS film $S_2$ after drying the substrate. The left side of FIG. 14 represents the number of residues in the case of adopting the substrate processing method according to the present example in which the above-described rinse liquid is used. The right side of FIG. 14 represents the number of residues in the case of omitting polishing with the water. As illustrated in FIG. 14, the case of adopting the method of the present example has the reduced number of residues on the TEOS film $S_2$ than the case of adopting the comparative method in which polishing with the water is omitted.

The above TEST results indicate that the residue can be effectively removed by using the water polishing in combination with the rinse liquid polishing, compared to the case of executing only one of the polishings.

Meanwhile, in the case of polishing the substrate W including the Cu wiring $S_1$ at the surface like the present example, the water polishing is executed with a polishing load 50 to 300 hPa for 5 or more seconds, and the rinse liquid polishing is executed with the polishing load 50 to 300 hPa for 10 or more seconds while dripping the rinse liquid on the polishing pad at the supply rate of 100 to 500 ml/min or more. The residue can be effectively removed by this.

Further, the Cu wiring $S_1$ is formed at the surface S of the substrate W in the present example, but metal wiring including other metals such as W and Al may be also formed. In this case, the components of the rinse liquid may be selected based on the metal included in the metal wiring and the slurry component used for polishing the metal. Further, a dielectric film such as $SiO_2$ film may be arbitrarily formed at the surface S of the substrate W instead of the TEOS film $S_2$.

Second Example

Figure 15:
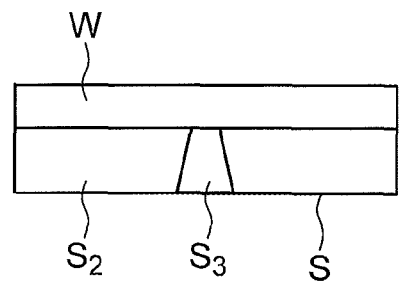
FIG. 15 is a cross-sectional view illustrating a substrate according to a second example.

Next, a second example will be described with reference to FIG. 15. FIG. 15 is a cross-sectional view illustrating a substrate W to be polished in the present example. As illustrated in FIG. 15, the substrate W in the present example includes a W wiring $S_3$ and a TEOS film $S_2$ at the surface thereof, and rinse liquid to remove residues adhered to the W wiring $S_3$ and the TEOS film $S_2$ is used. The slurry used for polishing W includes both types of acid and alkaline.

In the case where the slurry is alkaline, residue can be removed from the W wiring $S_3$ in the same manner as the Cu wiring $S_1$ by executing rinse liquid polishing with the alkaline rinse liquid described in the first example, and the roll brush cleaning.

On the other hand, in the case where the slurry is acid, since salt may be generated by the reaction of the slurry with the alkaline rinse liquid described in the first example, it is difficult to apply such a rinse liquid to the rinse liquid polishing. Therefore, in the case where the slurry is acid, preferably, the acid rinse liquid having dissolving property for W and the residue is used.

Meanwhile, in the case of the roll brush cleaning, the slurry is removed from the substrate W by the water polishing and the rinse liquid polishing. Therefore, chemical solution having any acid or alkaline property can be used regardless the acid or alkaline property of the slurry.

Third Example

Figure 16:
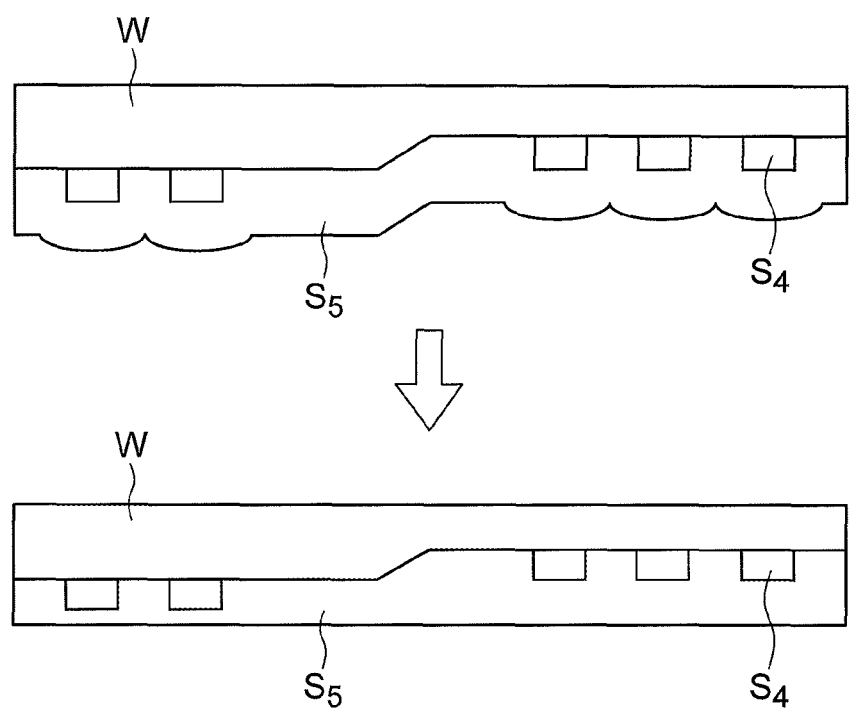
FIG. 16 is a cross-sectional view illustrating a substrate according to a third example.

Next, a third example will be described with reference to FIG. 16. FIG. 16 is a cross-sectional view illustrating a substrate W to be polished in the present example. As illustrated in FIG. 16, according to the present example, the substrate W includes an interlayer insulation film $S_5$ at the surface thereof, and metal wiring $S_4$ made of Cu and W is embedded inside the interlayer insulation film $S_5$. In other words, only the interlayer insulation film $S_5$ is polished in the present example. Therefore, the rinse liquid to remove residue adhered to the interlayer insulation film $S_5$ is used in the rinse liquid polishing.

The interlayer insulation film $S_5$ is, for example, a silica film such as $SiO_2$. In the case of polishing the interlayer insulation film $S_5$, generally, processing solution such as KOH and ammonia and the alkaline slurry including an abrasive grain such as silica are used. Therefore, the alkaline rinse liquid described in the first example can be used for the rinse liquid polishing for the interlayer insulation film $S_5$. Further, roll brush cleaning may be executed using the rinse liquid.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate processing method, comprising:
    polishing a surface of an object to be polished by a polishing pad supplied with slurry, the surface of the object to be polished being in contact with the polishing pad, wherein the object to be polished is disposed on a substrate;
    after polishing the surface of the object to be polished by the polishing pad supplied with slurry, polishing the surface of the object to be polished by the polishing pad supplied with water, the surface of the object to be polished being in contact with the polishing pad;
    after polishing the surface of the object to be polished by the polishing pad supplied with water, polishing the surface of the object to be polished by the polishing pad supplied with rinse liquid, the surface of the object to be polished being in contact with the polishing pad; and
    after polishing the surface of the object to be polished by the polishing pad supplied with rinse liquid, rinsing the surface of the object to be polished,
    wherein
    the object to be polished includes Cu disposed on the substrate, and the rinse liquid has pH of 8 or more and includes following components (A) to (F):
    (A) tetramethyl ammonium hydroxide,
    (B) diamines selected from a group including ethylenediamine and 1,2-diaminopropane,
    (C) organic acid selected from a group including oxalic acid, citric acid, tartaric acid, malic acid, and picoline acid,
    (D) histidine or derivative thereof,
    (E) at least one kind selected from a group including benzotriazol, imidazole, triazole, tetrazole, and derivative thereof, and
    (F) water.

2. The method according to claim 1, wherein the rinse liquid has an acid or alkaline property same as the slurry.

3. The method according to claim 1, wherein the rinse liquid has dissolving property for at least a part of the surface of the object to be polished.

4. The method according to claim 1, wherein the slurry includes an abrasive grain and processing solution.

5. The method according to claim 4, wherein the abrasive grain is at least one of $SiO_2$, $Al_2O_3$, $CeO_2$, $Mn_2O_3$, and diamond.

6. The method according to claim 4, wherein the processing solution is at least one of a modifying agent of the object to be polished, dispersing agent of the abrasive grain, a surfactant agent, a chelate agent, and anticorrosive.

7. The method according to claim 1, wherein the water is deionized water.

8. The method according to claim 1, wherein the object to be polished is consecutively processed on the same polishing pad.

9. The method according to claim 1, further comprising cleaning the surface of the object to be polished with a roll brush after polishing the surface with the rinse liquid.

10. The method according to claim 1, wherein the rinse liquid has dissolving property for at least a part of a residue on the surface.

11. A substrate processing method, comprising:
    polishing a surface of an object to be polished by a polishing pad supplied with slurry, the surface of an object to be polished being in contact with the polishing pad, wherein the object to be polished is disposed on a substrate;
    after polishing the surface of the object to be polished by the polishing pad supplied with slurry, polishing the surface of the object to be polished by the polishing pad supplied with water, the surface of the object to be polished being in contact with the polishing pad;
    after polishing the surface of the object to be polished by the polishing pad supplied with water, polishing the surface of the object to be polished by the polishing pad supplied with rinse liquid which includes a component (A) tetramethyl ammonium hydroxide, the surface of the object to be polished being in contact with the polishing pad; and
    after polishing the surface of the object to be polished by the polishing pad supplied with rinse liquid, rinsing the surface of the object to be polished.

* * * * *